US008683177B2

(12) United States Patent
Smith

(10) Patent No.: US 8,683,177 B2
(45) Date of Patent: *Mar. 25, 2014

(54) CONTENT ADDRESSABLE MEMORY (CAM) DEVICE AND METHOD FOR UPDATING DATA

(75) Inventor: Scott Smith, San Jose, CA (US)

(73) Assignee: NetLogic Microsystems, Inc., Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/596,495

(22) Filed: Aug. 28, 2012

(65) Prior Publication Data

US 2012/0324158 A1    Dec. 20, 2012

Related U.S. Application Data

(63) Continuation of application No. 11/000,568, filed on Nov. 30, 2004, now Pat. No. 8,266,373.

(60) Provisional application No. 60/531,830, filed on Dec. 23, 2003.

(51) Int. Cl.
*G06F 12/00* (2006.01)
(52) U.S. Cl.
USPC .................. 711/211; 711/108; 711/220
(58) Field of Classification Search
USPC .......................................... 711/108, 211, 220
See application file for complete search history.

(56) References Cited

U.S. PATENT DOCUMENTS

| | | |
|---|---|---|
| 4,296,475 A | 10/1981 | Nederlof et al. |
| 5,860,085 A | 1/1999 | Stormon et al. |
| 5,920,886 A | 7/1999 | Feldmeier |
| 6,081,440 A | 6/2000 | Washburn et al. |
| 6,134,135 A | 10/2000 | Andersson |
| 6,240,485 B1 | 5/2001 | Srinivasan et al. |
| 6,502,163 B1 | 12/2002 | Ramankutty |
| 6,549,442 B1 | 4/2003 | Lu et al. |
| 6,606,040 B2 | 8/2003 | Abdat |
| 6,647,457 B1 | 11/2003 | Sywyk et al. |
| 6,697,276 B1 | 2/2004 | Pereira et al. |
| 6,700,809 B1 | 3/2004 | Ng et al. |
| 6,757,779 B1 | 6/2004 | Nataraj et al. |
| 6,763,426 B1 | 7/2004 | James et al. |
| 6,772,279 B1 | 8/2004 | Sun et al. |
| 6,842,358 B2 * | 1/2005 | Khanna ...................... 365/49.1 |

(Continued)

OTHER PUBLICATIONS

Manish Pandev et al., Formal Verification of Content Addressable Memories Using Symbolic Trajectory Evaluation, pp. 167-172, published 1997, ISBN: 0-89791-920-3.

(Continued)

*Primary Examiner* — Reba I Elmore
(74) *Attorney, Agent, or Firm* — Sterne Kessler Goldstein & Fox PLLC

(57) ABSTRACT

A content addressable memory (CAM) (100) can include a CAM memory array (102) having both a data field (102-0) and a mask field (102-1). A multiplexer (MUX) (108) can selectively load data from either a register (104) or an external data input (106) to one or both fields (102-0 and 102-1) of CAM memory array (102).

20 Claims, 4 Drawing Sheets

(56) References Cited

U.S. PATENT DOCUMENTS

| | | |
|---|---|---|
| 6,876,558 B1 | 4/2005 | James et al. |
| 6,892,273 B1 | 5/2005 | James et al. |
| 7,111,123 B1 | 9/2006 | Zou |
| 7,117,301 B1 | 10/2006 | James et al. |
| 7,120,731 B1 | 10/2006 | Bhugra et al. |
| 7,451,267 B1 | 11/2008 | Venkatachary et al. |
| 8,266,373 B1 | 9/2012 | Smith |
| 2002/0186775 A1 | 12/2002 | Cordero et al. |
| 2004/0022082 A1 | 2/2004 | Khanna |

OTHER PUBLICATIONS

Sun et al., U.S. Appl. No. 10/197,298, filed Jul. 16, 2002, entitled "Search Method and Apparatus for Search Engine Device".

\* cited by examiner

| INSTRUCTION | CODE |
|---|---|
| Read | 0 0 0 0 |
| Write | 0 0 0 1 |
| Search | 0 1 0 0 |
| Learn (Reg) | 0 1 1 0 |
| Learn (Data Bus) | 0 1 1 1 |
FIG. 2
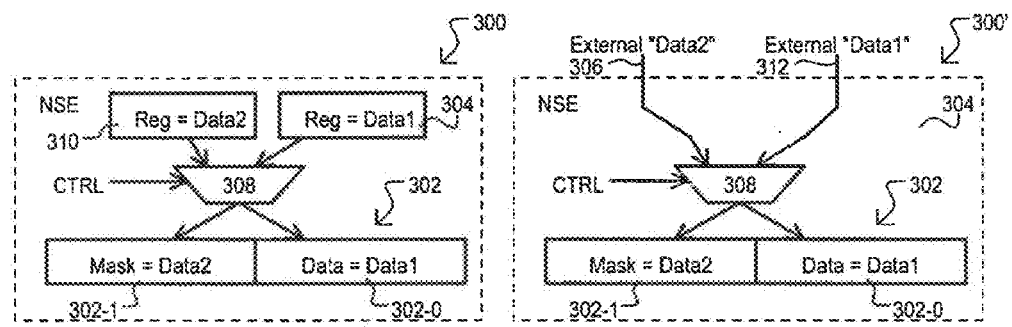
FIG. 3A  FIG. 3B
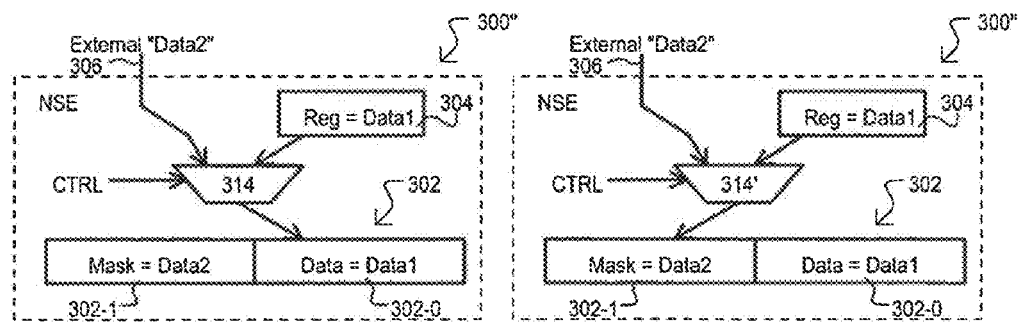
FIG. 3C  FIG. 3D

CONTENT ADDRESSABLE MEMORY (CAM) DEVICE AND METHOD FOR UPDATING DATA

This application is a continuation of U.S. patent application Ser. No. 11/000,568, filed Nov. 30, 2004, now U.S. Pat. No. 8,266,373 which claims the benefit of U.S. provisional patent application Ser. No. 60/531,830, filed Dec. 23, 2003.

TECHNICAL FIELD

The present invention relates generally to content addressable memory (CAM) devices, and more particularly to approaches to updating data in CAM devices.

BACKGROUND OF THE INVENTION

Content addressable memory (CAM) devices enjoy a variety of applications due to their fast matching capability. As an example, Network Search Engines (NSEs) often use CAM devices to provide fast searches of a database, list, and/or pattern, such as in computers and communication networks. A CAM can simultaneously compare a specific pattern of bits, commonly known as a search key or comparand, against a large number of bit patterns stored in an associated CAM memory array. In this way, an entire CAM array can be searched in parallel.

A CAM array may optionally have a mask value for each entry that indicates which bit location(s) in an entry to match, and hence which bits to exclude from a compare/search operation. If there is a match for every non-masked bit in a location (e.g., entry) with every corresponding bit of a comparand, a match flag can be asserted to let the user know that the comparand data was found in the CAM. In addition, a value corresponding to the matching location can be returned. Thus, in a CAM device a result can be determined from finding a matching value (content), not from providing the address for value, as is done for a Random Access Memory (RAM).

In some devices or systems, if no matching entries are found, a learn instruction can subsequently be executed. A learn instruction can instruct a CAM device to write comparand data used in a search, that resulted in a miss, into a next available empty location in the CAM array.

A conventional circuit and process of implementing a learn function or operation is shown in FIGS. 5A to 5C. A conventional circuit 500 can include a data field 502-0 and mask field 502-1. In addition, a conventional CAM circuit can include an internal comparand register 504 as a source of data for a learn operation. Data field 502-0 can include an available entry (represented by Data=???), while mask field 502-1 can include a mask for the available entry (represented by Mask=???).

Referring now to FIG. 5A, prior to a search operation, an internal comparand register 504 can be empty or store data from a previous operation that is not used (represented by Reg=???).

As shown in FIG. 5B, after a search operation has been executed and completed, comparand data from the search (Data1) can be stored in internal comparand register 504 (represented by Reg=Data1).

FIG. 5C shows the execution of a subsequent learn operation. Such an operation can occur whether or not the previous search operation resulted in no matching entries. When a learn operation is executed, comparand data (Data1) previously stored in internal comparand register 504 can be used as write data to be loaded data in to the internal CAM memory array.

A problem with the above conventional approach can be that when the learn instruction is executed, only the contents of internal register 504 are used for the write data. As shown in FIG. 5C, a learn instruction can result in a write to either a data field 502-0 or mask field 502-1 in the CAM memory array. Unfortunately, since there is only one internal register with a value inside, the same value gets written into either the mask or data field or to both. This can represent a limitation or failure of the conventional learn operation, as this is generally not what a user wants or intends.

In a learn operation, the user usually wants to store a <mask, data> pair into a free entry of a CAM memory array where the mask and data values could be different. Since a search operation only uses the data portion as the search key, the internal comparand register 504 will contain only the data portion, and the mask field cannot be updated with a unique or different value.

There have been several attempts to overcome or work around the above problem. Generally, such conventional approaches involve convoluted and costly solutions that are not wholly satisfactory. For example, a conventional approach can execute a learn operation to write data into a data field, as desired. Then, a number of extra read operations are performed to try and determine the address of the entry to which the data has been written. Once the address has been located, a unique mask value can be written into the corresponding location within the mask field.

Accordingly, it would be desirable to arrive at some way of updating both the mask field and the data field using a learn operation.

SUMMARY OF THE INVENTION

The present invention can provide solutions to these and other problems, and offers further advantages over conventional content addressable memories (CAMs) and methods of operating the same.

In one aspect, the present invention is directed to a CAM having a memory array with a first field for storing data, a second field for storing mask data, and a register for storing data. The CAM can further include a selection means adapted to load first data from either the register or an external data input to one or both of the first and second fields of the memory array.

Such an arrangement can enable the rapid loading of a mask from an external source in response to a learn operation. This can remove a constraint present in conventional approaches.

Preferably, a selection means can include a multiplexer (MUX) adapted to load first data from the register to one of the first and second fields of the CAM memory array, and to load second data from the external data input to the other field of the CAM memory array. More preferably, the first data can be loaded into the register as a result of a search operation executed in response to a search instruction. A MUX can select first or second data for loading into the first or second field of the memory array based on a control bit contained in a learn instruction.

Such an arrangement allows for simple writing of desired mask data with a small variation in an existing learn instruction.

Optionally, the CAM can include more than two external data inputs and/or more than one register, and the MUX can be adapted to load data from any one of the external data inputs or, more than one register to one or both of the first and second fields of the memory array, According to one aspect of the embodiments, a selecting step can include loading mask data into the second field and then loading data into the first field.

According to another aspect of the embodiments, a method can further include initially executing a search operation and loading a search key of the first operation into the register as first data.

According to another aspect of the embodiments, a method can include executing a learn operation in response to a learn instruction. A selecting step includes selecting first data and external data according to at least one bit of the learn instruction. In this way, a data path provided by a MUX can be selected with a learn instruction.

The present invention can also include a CAM device with a CAM array having a data field with a plurality of entries and a mask field that stores mask values corresponding to the entries. in addition, a MUX can have a first input coupled to receive an externally applied data value, a second input coupled to at least one register, and an output coupled to the data field and mask field. In this way, a CAM device can rapidly select from between a stored data value or an externally applied data value to provide an output value to a data field and/or mask field.

According to one aspect of the embodiments, a MUX can have a control input coupled to receive learn instruction data. In this way, a MUX operation can be controlled according to a learn instruction and/or associated data.

BRIEF DESCRIPTION OF THE DRAWINGS

FIG. 2 is a table showing instructions according to one embodiment of the present invention.

FIGS. 3A to 3D are block schematic diagrams showing alternate embodiments of the present invention.

DETAILED DESCRIPTION

The present invention is directed to a novel content addressable memory (CAM), and to circuits and methods for enabling the selection of a source for learn data, where such learn data can be loaded into multiple fields of a CAM array.

Figure 1A:
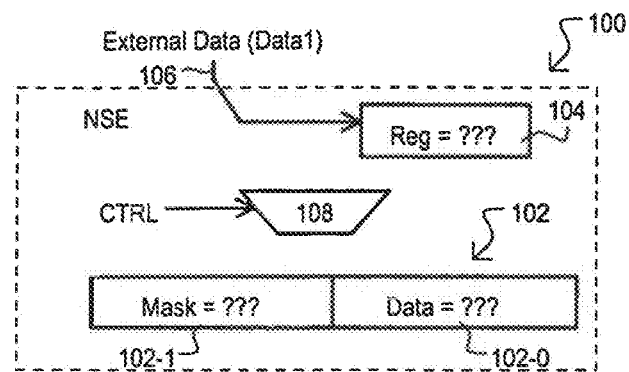
FIGS. 1A to 1C are block schematic diagrams showing a content addressable memory (CAM) and method according to embodiments of the present invention.
Figure 1B:
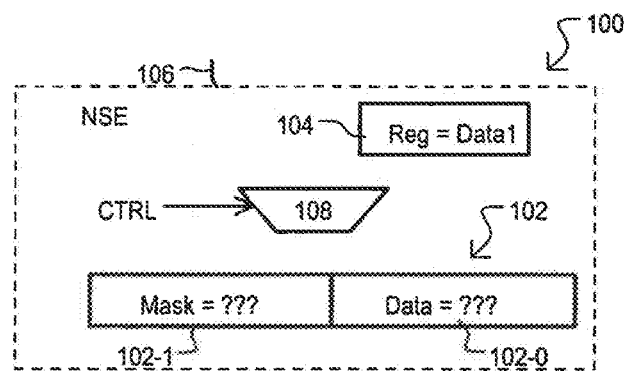
Figure 1C:
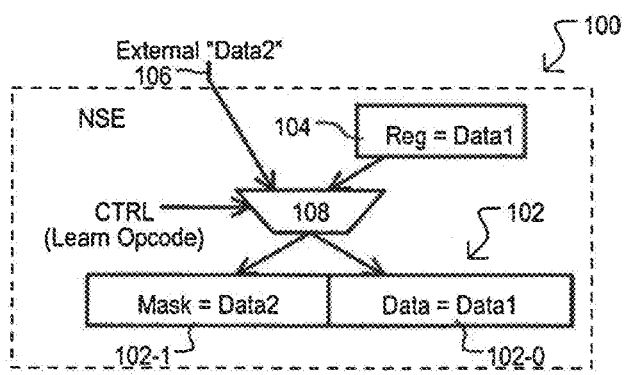

A CAM according to a first embodiment is shown in FIGS. 1A to 1C and designated by the general reference character 100. A CAM 100 can include a CAM memory array 102, a register 104, an external data input 106, and a multiplexer (MUX) 108.

A CAM memory array 102 can include a data field 102-0 and a mask field 102-1. According to well understood techniques, data values can be stored in data entries of data field 102-0. Each such data entry can have a corresponding mask entry in mask field 102-1. In a search operation, or the like, a search key value can be compared to data entries according to the corresponding mask value.

A register 104 can store data values for use in various operations in a CAM 100, including but not limited to, search operations and a learn operations. As but one very particular example, following a search operation a register 104 can store the search key value used to search the data entries. In a learn operation, a register 104 can continue to store such search key data, and such search key data can be loaded (e.g., written) into a selected available data entry.

An external data input 106 can receive data from outside a CAM 100. As but one example, such data may be received on an external data bus. In one even more particular example, an external data input 106 can receive mask data that accompanies a learn instruction.

A MUX 108 can be connected between register 104, external data input 106 and CAM memory array 102. Even more particularly, a MUX 108 can have one input connected to register 104, another input connected to external data input 106, and an output connected to CAM memory array 102. As is well understood, a MUX 108 can selectively provide data paths between in its inputs and outputs according to control data CTRL.

One particular operation of the CAM 100 will now be described with reference to FIGS. 1A to 1C. In the operation shown, a search operation is executed. Following the search operation, a learn operation is executed that stores a data value and mask value in a CAM memory array 102.

Referring to FIG. 1A, prior to a search operation, within CAM 100, a register 104 may not store a value, or may store a value that is no longer needed. This is represented by the notation "Reg.=???". In addition, a CAM memory array 102 can include an available entry. This is represented by the notation "Mask=??T and Data=???".

Referring to FIG. 1B, following a search operation, but prior to a learn operation, a data value (Data1)) can be stored in register 104. The data value (Data1) can be a search key, for example, utilized in the search operation. That is, a data value (Data1) can be supplied by or loaded in response to a previous search operation or instruction. This is represented by the notation "Reg.=Data1".

Referring to FIG. 1C, in a learn operation, a data value (Data1) can be provided to a CAM memory array 102 from register 104 by operation of MUX 108. In addition, and unlike conventional approaches, an externally received data value (Data2) can also be provided to CAM memory array 102 from external data input 106. In one particular example, an externally received data value (Data2) can be mask value that corresponds to data value (Data1).

FIG. 1C also shows how a MUX 108 can be controlled according to values generated in response to a learn command (e.g., learn opcode). As but one example, a new control bit can be added to a Learn Instruction and set by a user. When a Learn Instruction is executed, the new control bit can control a MUX (e.g., 108) in the data path, According to such control, a MUX 108 can select between data in register 104 (supplied by or loaded in response to a previous search operation or instruction) and data on an external data input 106.

For example, in the embodiment shown in FIG. 1C, first data (Data1)) loaded in register 104 (e.g. by a previous search instruction) can be loaded into the data field 102-0 in CAM memory array 102. Second data (Data2) can be loaded from external data input 106 the mask field 102-1 of CAM memory array 102.

It is understood that a MUX 108 can be subject to variation in form. For example, a MUX may provide sequential data paths to multiple fields (e.g., 102-0 and 102-1) or provide such paths in parallel, provided data are available at inputs of MUX 108.

One very particular approach to a learn instruction arrangement is shown in FIG. 2. FIG. 2 is a table showing a correspondence between instructions and resulting codes. The table shows well understood instructions: Read, Write and Search. However, the table also shows two variations of a Learn instruction. The two Learn instructions demonstrate how a least significant bit (LSB) can specify from which location data is loaded into a particular CAM memory array field. In the example shown, when an LSB of a Learn instruction is "0", data from a register can be loaded into a CAM memory array. Conversely, when an LSB of a learn instruction is "1", data from an data bus can be loaded into a CAM memory array.

It is understood that the above example represents but one possible arrangement. The operation of a MUX can be controlled by data provided generally "in conjunction" with a learn instruction. Thus, data establishing a particular MUX operation could be alternatively be stored in a register, and/or provided as a programmable mode of operation for a CAM.

Along these same lines, a Learn instruction could result in the automatic sequential loading of data from a register and external source. For example, the same learn instruction could result in data from a register (e.g., 104) being written into a data field 102-0, followed by the automatic writing of data from an external data input (e.g., 106) into a mask field 102-1.

Of course, while the above embodiments have shown particular arrangements, it will be appreciated that various alternative embodiments of the CAM are possible. A few examples of possible alternative embodiments are shown in FIGS. 3A to 3D. The alternate embodiments include some of the same general components as FIGS. 1A to 1C. Accordingly, like components will be referred to by the same reference character but with the first digit being a "3" instead of a "1", and a description thereof will be omitted.

FIG. 3A shows how a MUX 308 can select between two internal registers. Thus, the CAM of FIG. 3A can include a first internal register 304 and a second internal register 310 connected to inputs of MUX 308.

FIG. 3B shows how a MUX 308 can select between two external data inputs. Thus, the CAM of FIG. 3B can include a first internal external data input 306 and a second external data input 312 connected to inputs of MUX 308.

Of course, according to other embodiments, a MUX can select from between a combination of any number of inputs and/or registers.

Still further, while the above embodiments have shown arrangements in which data can be written to a mask field and a data field, it will be appreciated that a MUX can be operated to write to the mask field only or to the data field only.

FIG. 3C shows how a CAM can include a MUX 314 that can write to only a data field 302-0. FIG. 3D shows how a CAM can include a MUX 314' that can write to only a mask field 302-1.

According to another embodiment, a method or process can include automatically updating both a mask field and data field of a CAM according to a learn instruction. Such a method is set forth in FIG. 4 in a flowchart, and designated by the general reference character 400.

A method 400 can include issuing a search instruction using a data value as a search key 402. Such an operation can include a user issuing a search instruction in conjunction with appropriate search key data.

In one particular approach, if a search operation is successful (e.g., a search key matches an entry value), no learn operation can be performed. If, however, a search operation fails (e.g., a search key does not match any entries), a learn operation can be performed.

In either case (search success or failure), the search key can be loaded into the internal register (404).

Figure 4:
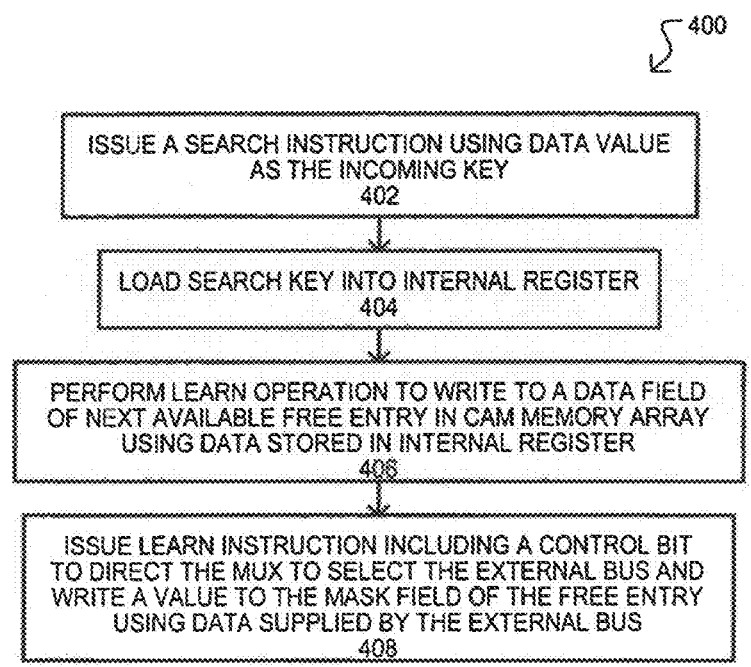
FIG. 4 is a flowchart showing a method according to an embodiment of the present invention.
Figure 5A:
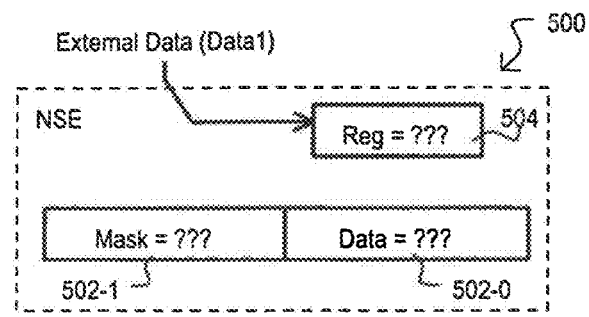
FIGS. 5A to 5C are block schematic diagrams showing a conventional CAM operation.
Figure 5B:
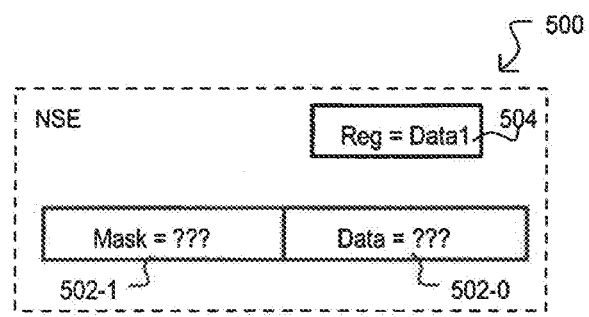
Figure 5C:
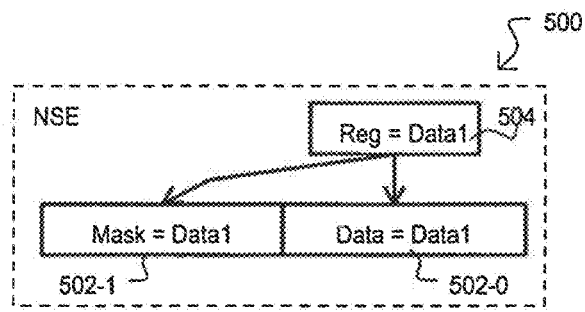

The particular diagram of FIG. 4 assumes that a search fails. Consequently, a learn operation can be executed. More particularly, a learn operation can write to a data field of a next available free entry in a CAM memory array. The data for the write operation can be data stored in an internal register (406).

In one very particular arrangement, a step 406 can be executed in response to a first issued learn instruction.

Unlike a conventional approach, a method 400 can further include issuing a second learn instruction having a control bit that directs a MUX to select an external bus as a source of load data. Data can then be written to the mask field of the available free entry using data supplied by the external bus (408).

It will be appreciated that the order in which data is written to a mask field and a data field should not be considered limiting to the present invention.

An advantage of the CAM and method according to the various embodiments can be the efficient and automatic update of both the mask and the data fields of a free entry in the CAM memory array using the same instruction.

It is also understood that the embodiments of the invention may be practiced in the absence of an element and/or step not specifically disclosed. That is, an inventive feature of the invention can be elimination of an element.

The foregoing description of specific embodiments and examples of the invention have been presented for the purpose of illustration and description, and although the invention has been described and illustrated by certain of the preceding examples, it is not to be construed as being limited thereby. They are not intended to be exhaustive or to limit the invention to the precise forms disclosed, and many modifications, improvements and variations within the scope of the invention are possible in light of the above teaching. It is intended that the scope of the invention encompass the generic area as herein disclosed, and by the claims appended hereto and their equivalents.

What is claimed is:

1. A content addressable memory (CAM), comprising:
a CAM memory array including a first field configured to store data and a second field configured to store mask data corresponding to the data in the first field;
a register coupled to a data input and configured to receive the data from the data input; and
a circuit coupled to the register, to the data input, and to the first and second fields of the CAM memory array, and configured to selectively provide the data from the register to the first field or provide the mask data from the data input to the second field of the CAM memory array.

2. The CAM of claim 1, wherein the circuit comprises: a MUX configured to load the data from the register to the first field of the CAM memory array, and to load the mask data from the data input to the second field of the CAM memory array.

3. The CAM of claim 1, wherein the register is configured to store search key data from a search operation.

4. The CAM of claim 1, wherein the circuit comprises: a control input configured to receive learn instruction data.

5. The CAM of claim 4, wherein the learn instruction data comprises: a bit in a learn instruction applied to the CAM.

6. The CAM of claim 1, wherein the circuit is configured to load the data into the first field of the CAM memory array and to load the mask data into the second field of the CAM memory array.

7. The CAM of claim 1, further comprising:
N data inputs, where N is a whole number greater than 2; and
wherein the circuit is configured to load the mask data from one of the N data inputs to the second field of the CAM memory array.

8. The CAM of claim 1, further comprising:
M registers, where M is a whole number greater than 1; and
wherein the circuit is configured to load the data from one of the M registers to the first field of the CAM memory array.

9. A method to store data in a content addressable memory (CAM), comprising:
storing data from a first data input in a register of the CAM;
receiving mask data corresponding to the data from a second data input; and
selecting to load, using a circuit, the data or the mask data from the register or the second data input to first or second fields of the CAM.

10. The method of claim 9, wherein the selecting step comprises using the circuit to provide first data from the register to the first field of the CAM and the mask data from the second data input to the second field of the CAM.

11. The method of claim 9, wherein the selecting step comprises loading the mask data into the second field and then loading the data into the first field.

12. The method of claim 9, further comprising:
executing a search operation; and
loading a search key of the search operation into the register as the data.

13. The method of claim 9, further comprising:
executing a learn operation in response to a learn instruction; and
wherein the selecting step comprises selecting the data or the mask data according to at least one bit of the learn instruction.

14. A content addressable memory (CAM) device, comprising:
a CAM array having a data field with a plurality of entries and a mask field that stores mask values corresponding to the plurality of entries; and
a selection circuit comprising a first input configured to receive a first data value, a second input coupled to a register, and an output coupled to the CAM array,
wherein the register stores a search key value following a search operation.

15. The CAM device of claim 14, wherein the selection circuit comprises: a control input configured to receive learn instruction data.

16. The CAM device of claim 15, wherein the selection circuit further comprises: a control input coupled to a signal that corresponds to a bit value of the learn instruction.

17. The CAM device of claim 14, wherein the selection circuit is configured to couple a search key value from a previous search operation to the data field, and a corresponding mask value from an external input to the mask field in response to a learn operation command.

18. The CAM device of claim 14, wherein the selection circuit is coupled to the second input so as to receive a second data value from one of a plurality of data inputs.

19. The CAM device of claim 14, wherein the first input of the selection circuit is coupled to a plurality of registers.

20. The CAM device of claim 14, wherein the first data value is an externally applied data value.

* * * * *